United States Patent
Hooker et al.

(10) Patent No.: US 8,536,838 B2
(45) Date of Patent: Sep. 17, 2013

(54) CAPACITANCE CHECK AND VOLTAGE MONITORING CIRCUIT FOR USE WITH A CIRCUIT PROTECTION DEVICE

(75) Inventors: John Kenneth Hooker, Louisville, KY (US); Hardik Upadhyay, Monroe, CT (US); Gitika Tantuwaya, Louisville, KY (US)

(73) Assignee: General Electric Company, Schenectady, NY (US)

( * ) Notice: Subject to any disclaimer, the term of this patent is extended or adjusted under 35 U.S.C. 154(b) by 309 days.

(21) Appl. No.: 12/967,266

(22) Filed: Dec. 14, 2010

(65) Prior Publication Data

US 2012/0147505 A1    Jun. 14, 2012

(51) Int. Cl.
*H02J 7/00* (2006.01)
*H02J 7/04* (2006.01)
*H01G 2/12* (2006.01)

(52) U.S. Cl.
USPC .............................. 320/166; 320/162; 361/15

(58) Field of Classification Search
USPC ........................................................ 320/166
See application file for complete search history.

(56) References Cited

U.S. PATENT DOCUMENTS

| | | | |
|---|---|---|---|
| 3,229,158 | A | 1/1966 | Jensen |
| 3,248,605 | A | 4/1966 | Tomkinson |
| 4,346,420 | A | 8/1982 | Turchi |
| 5,036,284 | A | 7/1991 | Cichanski |
| 6,240,534 | B1 | 5/2001 | Nakane |
| 6,576,922 | B1 | 6/2003 | Ma et al. |
| 7,411,374 | B2 | 8/2008 | Tan et al. |
| 7,710,080 | B2 | 5/2010 | Kobayashi et al. |
| 2008/0169791 | A1 | 7/2008 | Daio |
| 2008/0239592 | A1 | 10/2008 | Roscoe et al. |
| 2010/0194354 | A1 | 8/2010 | Gotou et al. |
| 2012/0056599 | A1* | 3/2012 | Robarge et al. ............... 320/166 |

OTHER PUBLICATIONS

Search Report from corresponding EP Application No. 11191548.4 May 15, 2012.

* cited by examiner

*Primary Examiner* — M'Baye Diao
(74) *Attorney, Agent, or Firm* — Global Patent Operation; Stephen G. Midgley

(57) ABSTRACT

A circuit protection device includes a plasma gun, at least one capacitor communicatively coupled to the plasma gun, and a monitoring circuit communicatively coupled to the at least one capacitor. The capacitor is configured to store electrical energy and to provide the electrical energy to the plasma gun. The monitoring circuit is configured to measure a charge property of the at least one capacitor, determine a charge status of the at least one capacitor based on the measured charge property, and output at least one signal indicative of the charge status.

20 Claims, 6 Drawing Sheets

CAPACITANCE CHECK AND VOLTAGE MONITORING CIRCUIT FOR USE WITH A CIRCUIT PROTECTION DEVICE

BACKGROUND OF THE INVENTION

The embodiments described herein relate generally to a circuit protection device and, more particularly, to an apparatus for use in monitoring a charge status and voltage levels of a plurality of capacitors of a circuit protection device.

Known electric power circuits and switchgear generally have conductors that are separated by insulation, such as air, or gas or solid dielectrics. However, if the conductors are positioned too closely together, or if a voltage between the conductors exceeds the insulative properties of the insulation between the conductors, an arc can occur. For example, the insulation between the conductors can become ionized, which makes the insulation conductive and enables formation of an arc flash.

An arc flash includes a rapid release of energy due to a fault between two phase conductors, between a phase conductor and a neutral conductor, or between a phase conductor and a ground point. Arc flash temperatures can reach or exceed 20,000° C., which can vaporize the conductors and adjacent equipment. Moreover, an arc flash can release significant energy in the form of not only heat, but also intense light, pressure waves, and/or sound waves, sufficient to damage the conductors and adjacent equipment. However, the current level of a fault that generates an arc flash is generally less than the current level of a short circuit, such that a circuit breaker generally does not trip or exhibits a delayed trip unless the circuit breaker is specifically designed to handle an arc fault condition. Although agencies and standards exist to regulate arc flash issues by mandating the use of personal protective clothing and equipment, there is no device established by regulation that eliminates arc flash.

At least some known circuit protection devices include a number of high voltage and high energy capacitors for use in initiating a secondary arc flash within an enclosure that is designed to safely contain the energy released by the secondary arc flash. These capacitors can be used to provide energy to an ablative plasma gun that releases plasma into a gap between a plurality of electrodes to facilitate formation of the secondary arc flash. However, it is difficult to observe the charge status of these capacitors. Unracking these circuit protection devices while the capacitors are charged or are charging can lead to severe electrical shocks or burns if an operator were to come into contact with the capacitors that store high voltage. Accordingly, it is desirable to provide a means of monitoring and indicating the charge status of the capacitors and/or a means to alter the charge status of the capacitors.

BRIEF DESCRIPTION OF THE INVENTION

In one aspect, a circuit protection device includes a plasma gun, at least one capacitor communicatively coupled to the plasma gun, and a monitoring circuit communicatively coupled to the at least one capacitor. The capacitor is configured to store electrical energy and to provide the electrical energy to the plasma gun. The monitoring circuit is configured to measure a charge property of the at least one capacitor, determine a charge status of the at least one capacitor based on the measured charge property, and output at least one signal indicative of the charge status.

In another aspect, a controller is provided for use with a circuit protection device having a plasma gun. The controller includes a plurality of capacitors including at least one first capacitor configured to provide electrical energy to the plasma gun and at least one second capacitor configured to provide a pulse to the plasma gun to cause the plasma gun to create a plasma plume using the electrical energy. The controller also includes a monitoring circuit communicatively coupled to the plurality of capacitors. The monitoring circuit is configured to measure a first charge property for the at least one first capacitor and the at least one second capacitor, measure a second charge property for the at least one first capacitor, determine a charge status for the at least one first capacitor and the at least one second capacitor based on the first charge property and the second charge property, and output a signal indicative of the charge status.

In another aspect, a method is provided for monitoring capacitance and voltage of a plurality of capacitors for use in a circuit protection device, wherein the plurality of capacitors includes at least one first capacitor and at least one second capacitor. The method includes measuring a first charge property for each of the at least one first capacitor and the at least one second capacitor, measuring a second charge property for the at least one first capacitor, determining a charge status for the at least one first capacitor and the at least one second capacitor based on the first charge property and the second charge property, and outputting a signal indicative of the charge status.

DETAILED DESCRIPTION OF THE INVENTION

Exemplary embodiments of systems, methods, and apparatus for use in monitoring capacitance and voltages of capacitors within a circuit protection device are described herein. These embodiments facilitate monitoring whether an electrolytic capacitor, or a bank of capacitors, has sufficient capacitance by monitoring a charge time during the capacitor's initial linear charge phase. When driven by a substantially constant current source, the change in a capacitor's voltage over time is generally linear between approximately 5% and 10% of a rated charge value. The embodiments described herein provide a monitoring circuit that creates multiple references used to check capacitor charge using comparators that are activated when a desired voltage is detected on the capacitors. Moreover, logic gates generate a trigger edge that, in turn, triggers a timer. An additional logic gate is then triggered by the output of the timer to clock the state of the comparators at the end of a preselected time period. If a comparator associated with a particular charge level of the capacitors has changed, then the monitoring circuit determines that the capacitance level of the capacitors is less than the desired level and indicates this via an output device. However, if the comparator output has not changed, the monitoring circuit determines that the capacitance level is greater than or equal to the desired level. The monitoring circuit indicates this charge status via a different output device. The embodiments described herein also facilitate monitoring the voltage level of the capacitors to ensure that the minimal required voltage level is present. This ensures that no single point of failure in the circuit protection device will cause the monitoring circuit to output a false positive, whereby the circuit protection device appears to an operator to be in a working state when it is not. Furthermore, the embodiments described herein enable an operator to determine whether the circuit protection device is read to trigger upon detection of an arc flash or other arc event, or whether the circuit protection device requires service.

Figure 1:
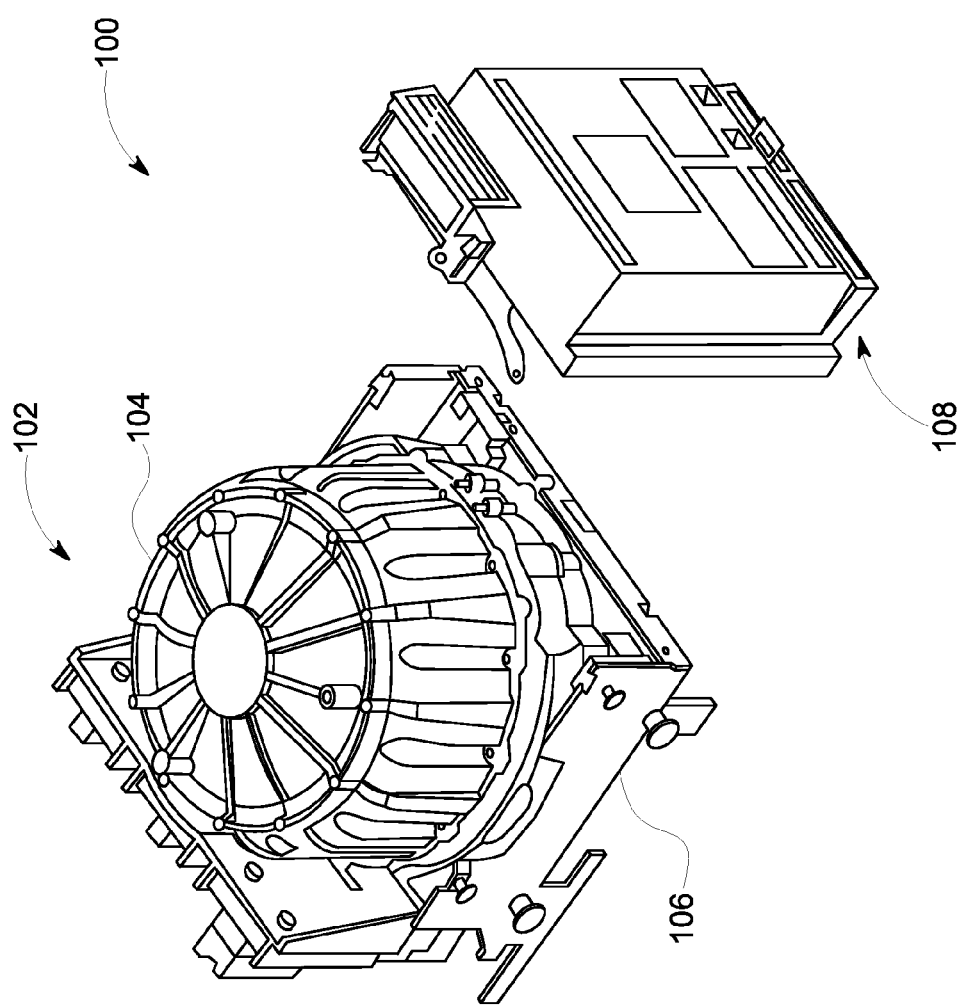
FIG. 1 is a perspective view of an exemplary circuit protection device for use with power distribution equipment.

FIG. 1 is a perspective view of an exemplary circuit protection device 100 for use with power distribution equipment. Device 100 includes a containment assembly 102 that includes a plurality of main electrodes (not shown) separated by a main gap of air or another gas. Each main electrode is coupled to an electrically different portion of a power circuit, such as different phases, neutral, or ground. Containment assembly 102 also includes a trigger circuit (not shown) that activates an ablative plasma gun (not shown) by transmitting an electrical pulse to the plasma gun. In response to the pulse, the plasma gun emits ablative plasma that facilitates the creation of an arc between the main electrodes. The arc is created to divert energy from an arc flash elsewhere on the circuit for protection of the circuit. Moreover, containment assembly 102 includes an outer cover 104 that contains and isolates the energy created by the arc. Containment assembly 102 is sized to be coupled to a cassette 106 so that containment assembly 102 can be inserted into an equipment enclosure (not shown). Moreover, device 100 includes a controller 108 that is communicatively coupled to containment assembly 102. Controller 108 receives signals from one or more sensors (not shown) that monitor the circuit to detect an arc flash. The sensors may monitor a current through a portion of the circuit and/or a voltage across multiple portions of the circuit. The sensors may also detect a light flash that can be produced by an arc flash. In response to the signals, controller 108 activates the plasma gun within containment assembly 102 to initiate an arc.

Figure 2:
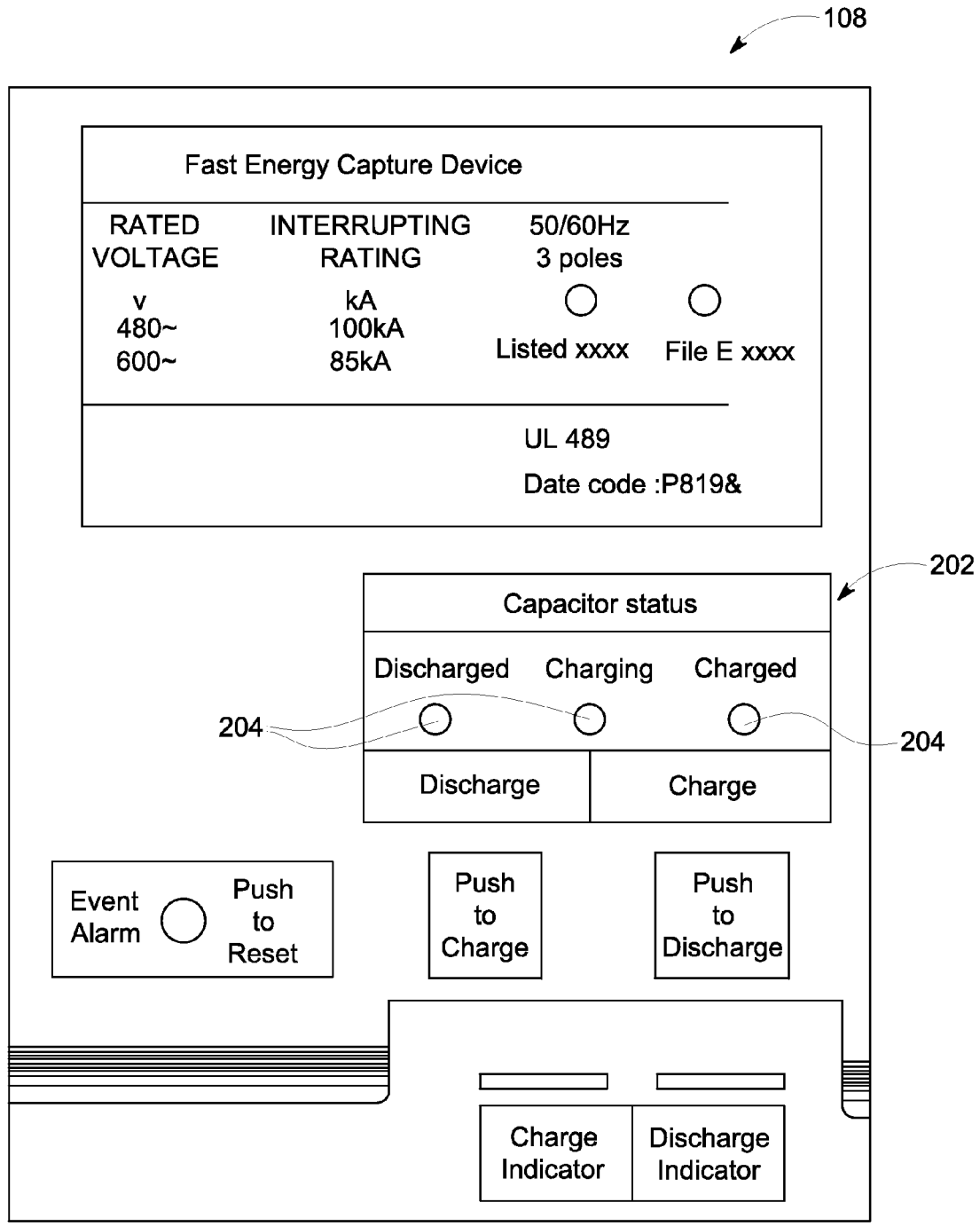
FIG. 2 is a front view of a controller that may be used with the circuit protection device shown in FIG. 1.

FIG. 2 is a front view of controller 108. As shown in FIG. 2, controller 108 includes a status indicator 202 that displays a capacitor charge status via a plurality of output devices 204. For example, status indicator 202 indicates whether a plurality of capacitors is charged, charging, or discharged. Output devices 204 may be, for example, light emitting diodes (LEDs).

Figure 3:
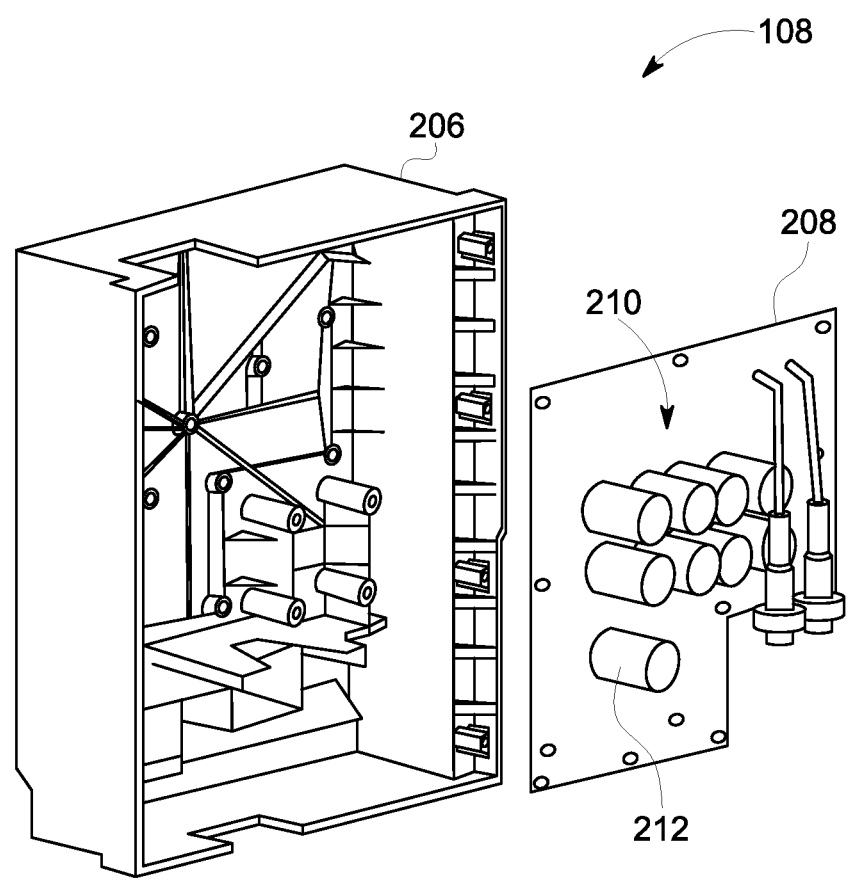
FIG. 3 is a partial exploded view of the controller shown in FIG. 2.

FIG. 3 is a partial exploded view of controller 108, which includes a housing 206 sized to contain a printed circuit board (PCB) 208. PCB 208 includes a plurality of first capacitors 210 and one or more second capacitors 212 electrically coupled thereto. First capacitors 210 may also be referred to herein as activation capacitors, and are used to provide power to the plasma gun of containment device 102 (shown in FIG. 1) for use in creating an arc within containment device 102. Second capacitor 212 may also be referred to herein as a pulse capacitor, and is used to provide a pulse signal to the plasma gun after the power is provided to the plasma gun. The pulse signal causes the plasma gun to create an arc plume.

Figure 4:
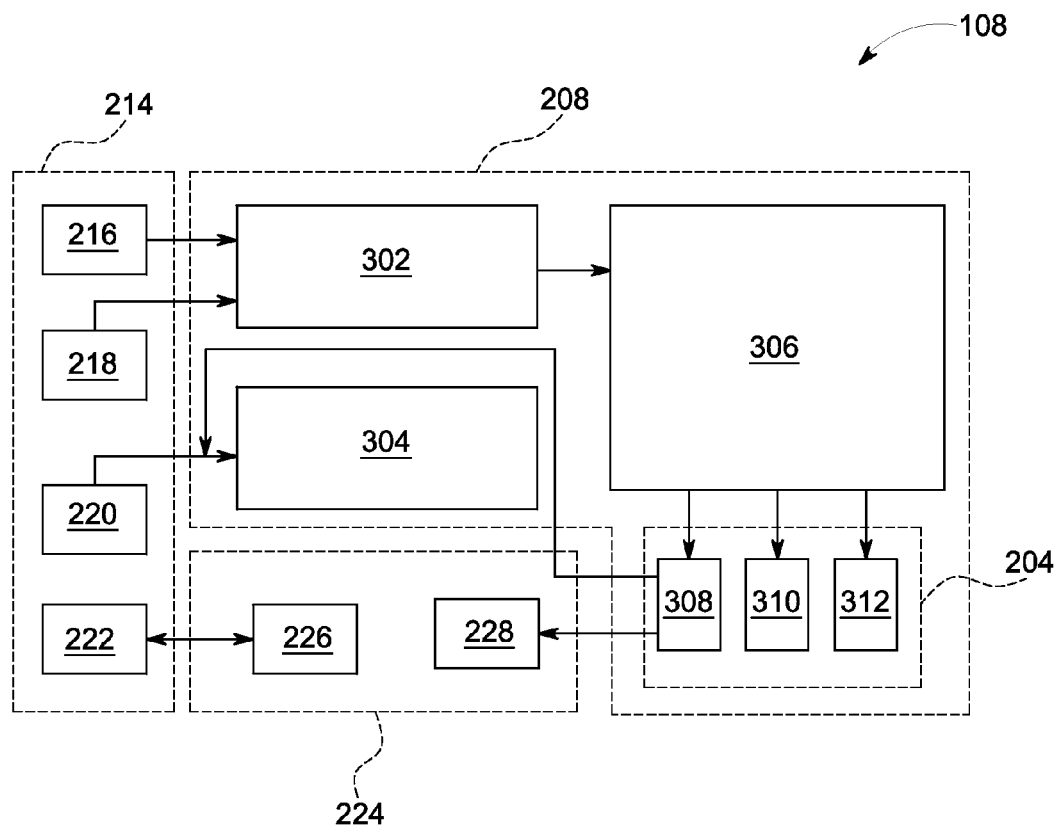
FIG. 4 is a schematic block diagram of the controller shown in FIG. 2.

FIG. 4 is a schematic block diagram of controller 108. In an exemplary embodiment, controller 108 includes a plurality of input connectors 214 including, for example and not by way of limitation, power supply input connectors 216, capacitor charge/discharge device input connectors 218, relay input connectors 220, and alarm input connectors 222. Power supply input connectors 216 facilitate receiving power from a power supply (not shown) for use in powering controller 108 and providing energy to the plasma gun. Capacitor charge/discharge device input connectors 218 facilitate receiving a user input to charge first capacitors 210 and second capacitor 212 (shown in FIG. 3) and/or a user input to discharge first capacitors 210 and second capacitor 212. Relay input connectors 220 facilitate receiving a signal indicative of an arc flash detection in a circuit and causing the plasma gun to create an arc plume to transfer the arc flash energy into arc containment device 102 (shown in FIG. 1). Alarm input connectors 222 receive signals from an alarm device (not shown). Moreover, controller 108 includes a plurality of output connectors 224 including, for example, alarm output connectors 226 and capacitor status signal output connectors 228. Alarm output connectors 226 transmit signals to the alarm device to facilitate presenting an indication that the plasma gun has fired to create the arc plume. Capacitor status signal output connectors 228 couple to output devices 204.

In an exemplary embodiment, PCB 208 communicatively couples to input connectors 214 and output connectors 224 to facilitate communicating with the above-described devices. Moreover, PCB 208 includes circuitry for use in monitoring the operating status of, for example, first capacitors 210 and second capacitor 212. In an exemplary embodiment, PCB 208 includes a power circuit 302 that receives power from the power supply via power supply input connectors 216. Power circuit 302 provides low-voltage power, such as approximately 12 Volt power, to low-voltage electronic components of controller 108, such as integrated circuits, field-effect transistors, and the like. Power circuit 302 also converts a portion of the low-voltage power to high-voltage power for use by high-energy and high-voltage electronic components of controller 108, such as first capacitors 210 and second capacitor 212. To facilitate charging first capacitors 210 and second capacitor 212, power circuit 302 also receives input signals via capacitor charge/discharge device input connectors 218 and causes first capacitors 210 and/or second capacitor 212 to charge or discharge based on the input signals.

PCB 208 also includes a plasma gun circuit 304 that is communicatively coupled to the plasma gun. Plasma gun circuit 304 receives a relay fire signal via relay input connectors 220 to facilitate causing the plasma gun to create an arc plume to transfer the arc flash energy into arc containment device 102. For example, in response to the relay fire signal, plasma gun circuit 304 causes first capacitors 210 to release stored energy to the plasma gun. Moreover, plasma gun circuit 304 causes the plasma gun to use the released energy to create an arc plume by causing second capacitor 212 to transmit a high-voltage pulse signal to the plasma gun. In response to the pulse signal, the plasma gun uses the released energy to create the arc plume by breaking down an air gap between the plasma gun electrodes (not shown).

In an exemplary embodiment, PCB 208 also includes a monitoring circuit 306 for use in monitoring the charge status of first capacitors 210 and second capacitor 212. For example, monitoring circuit 306 measures a first charge property for first capacitors 210 and second capacitor 212, and measures a second charge property for first capacitors 210. Moreover, monitoring circuit 306 determines a charge status for first capacitors 210 and second capacitor 212 based on the first charge property and the second charge property, and presents an indication of the charge status via output devices 204. Specifically, monitoring circuit 306 monitors reference voltages of first capacitors 210 and second capacitor 212, monitors a change in stored voltage over time for first capacitors 210, and monitors the power supply voltage received via power supply input connectors 216.

Furthermore, monitoring circuit 306 includes a first output device 308, a second output device 310, and a third output device 312. In an exemplary embodiment, first output device 308 indicates to an operator that (a) low-voltage power supply is available, (b) first capacitors 210 are charged to a desired level, (c) first capacitors 210 are charged to the desired level within a desired time period, and (d) second capacitor 212 is charged to a desired level. Second output device 310 indicates to the operator that first capacitors 210 and/or second capacitor 212 are discharged. Third output device 312 indicates to the operator that first capacitors 210 and second capacitor 212 are charging, are discharging, or failed to charge or discharge within a desired time.

Figure 5:
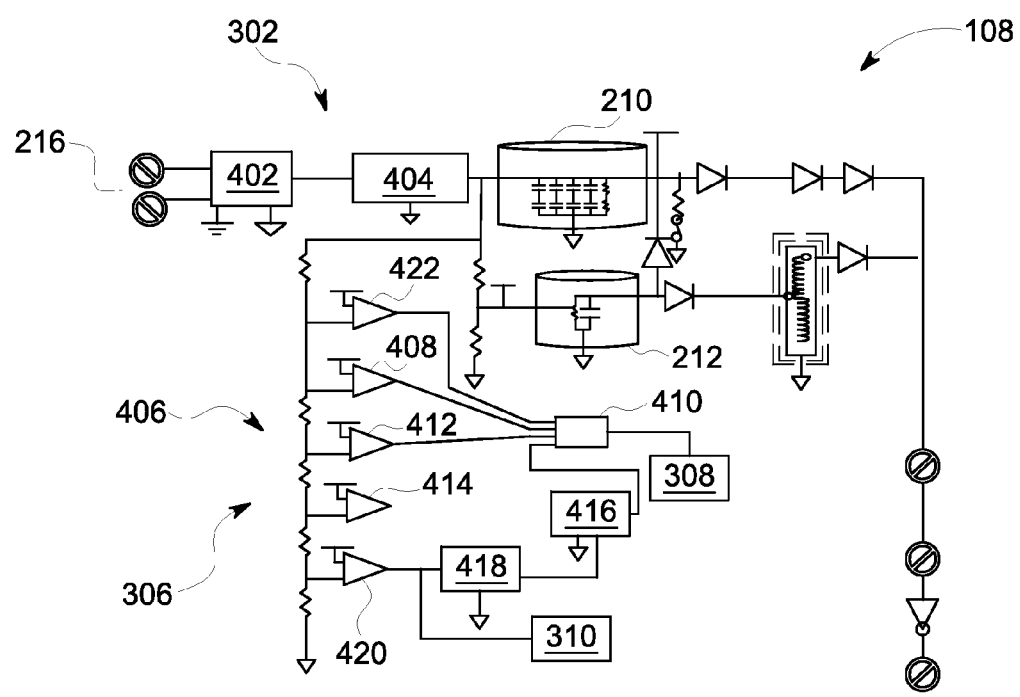
FIG. 5 is a simplified circuit diagram of an exemplary power circuit, monitoring circuit, and output devices that may be used with the controller shown in FIG. 2.

FIG. 5 is a simplified circuit diagram of power circuit 302, monitoring circuit 306, and output devices 204. In an exemplary embodiment, power circuit 302 includes one or more voltage regulators 402 that receive electrical power via power supply input connectors 216. Voltage regulators 402 condition the power and output low-voltage power for use by low-voltage electrical components of controller 108 (shown in FIG. 3). Moreover, power circuit 302 includes a voltage converter 404 that converts a portion of the low-voltage power into high-voltage power for use by high-voltage electrical components of controller 108, such as first capacitors 210 and second capacitor 212.

In an exemplary embodiment, first capacitors 210 include a bank of high-voltage, high-energy capacitors. Exemplary capacitors that may be used in the capacitor bank of first capacitors 210 include capacitors having a capacitance of approximately 180 microfarads (μF) at approximately 450 volts (V). However, it should be understood that any suitable high-voltage, high-energy capacitor may be used within first capacitors 210, including capacitors having a capacitive rating of more or less than approximately 180 μF and operating at more or less than approximately 450 V. In an exemplary embodiment, second capacitor 212 is a single high-voltage capacitor. An exemplary capacitor that may be used as second capacitor 212 is one having a capacitance of approximately 47 μF at approximately 450 V. However, it should be understood that any suitable high-voltage, high-energy capacitor may be used within second capacitor 212, including a capacitor having a capacitive rating of more or less than approximately 47 μF and operating at more or less than approximately 450 V.

In an exemplary embodiment, monitoring circuit 306 also includes a plurality of comparators 406. A first comparator 408 compares a voltage for second capacitor 212 to a first threshold voltage and outputs a result of the comparison to an AND gate 410. For example, if the voltage is greater than or equal to the first threshold voltage, first comparator 408 outputs a logic "high" signal or, if the voltage is less than the first threshold voltage, first comparator 408 outputs a logic "low" signal. Similarly, a second comparator 412 compares a voltage of first capacitors 210 to the first threshold voltage and outputs a result of the comparison to AND gate 410. For example, if the voltage is greater than or equal to the first threshold voltage, second comparator 412 outputs a logic "high" signal or, if the voltage is less than the first threshold voltage, second comparator 412 outputs a logic "low" signal.

Moreover, a third comparator 414 compares the voltage of first capacitors 210 to a second threshold voltage and determines whether first capacitors 210 reach the second threshold voltage within a threshold time. The time is measured by a logic gate 416 that is triggered by an output of a timer 418. If first capacitors 210 do not charge to the second threshold voltage within the threshold time, monitoring circuit 306 does not output a first signal, such as an activation signal, to AND gate 410, which causes first output device 308 to remain deactivated or off and causes third output device 312 to remain activated or on. If first capacitors 210 do charge to the second threshold voltage within the threshold time, the result is output to logic gate 416. A fourth comparator 420 compares the voltage of first capacitors 210 to a third threshold voltage that is higher than the second threshold voltage. Logic gate 416 also measures a time necessary for first capacitors 210 to reach the third threshold voltage. If first capacitors 210 do charge to the third threshold voltage within the threshold time, logic gate 416 outputs a logic "high" signal to AND gate 410 or, if first capacitors 210 do not charge to the third threshold voltage within the threshold time, logic gate 416 outputs a logic "low" signal to AND gate 410. Furthermore, a fifth comparator 422 compares the voltage output by power circuit 302 to a fourth threshold voltage to determine whether the supply voltage provided by power circuit 302 is at least a desired voltage. If the supply voltage is at least equal to the fourth threshold voltage, fifth comparator 422 outputs a logic "high" signal to AND gate 410 or, if the supply voltage is not at least equal to the fourth threshold voltage, fifth comparator 422 outputs a logic "low" signal to AND gate 410.

When AND gate 410 receives all logic "high" signals from first comparator 408, second comparator 412, fifth comparator 422, and logic gate 416, monitoring circuit 306 outputs a second signal that causes first output device 308 to indicate that first capacitors 210 and second capacitor 212 are successfully charged. Monitoring circuit 306 outputs a third signal that causes third output device 312 to indicate that first capacitors 210 and second capacitor 212 are charging or discharging, or that first capacitors 210 and/or second capacitor 212 failed to charge or discharge within a threshold time period.

In alternative embodiments of monitoring circuit 306, one or more components can be substituted to redesign the circuit while providing similar functionalities. For example, different reference voltages may be created using different resistors, using different reference voltage, different comparator chips, using different types of timers and D-flip-flops, and/or logic gates to get similar results. Moreover, different configuration of transistors, such as NPN to PNP bipolar junction transistors, and/or P-channel to N-channel MOSFETs can create tweaks in monitoring circuit 306. Furthermore, output devices 308, 310, and 312 may be LEDs, or any suitable electromechanical device, such as relay or display, that provides similar operator output. In addition, one or more functions described herein can be implemented using a microprocessor that executes programmable code.

Figure 6:
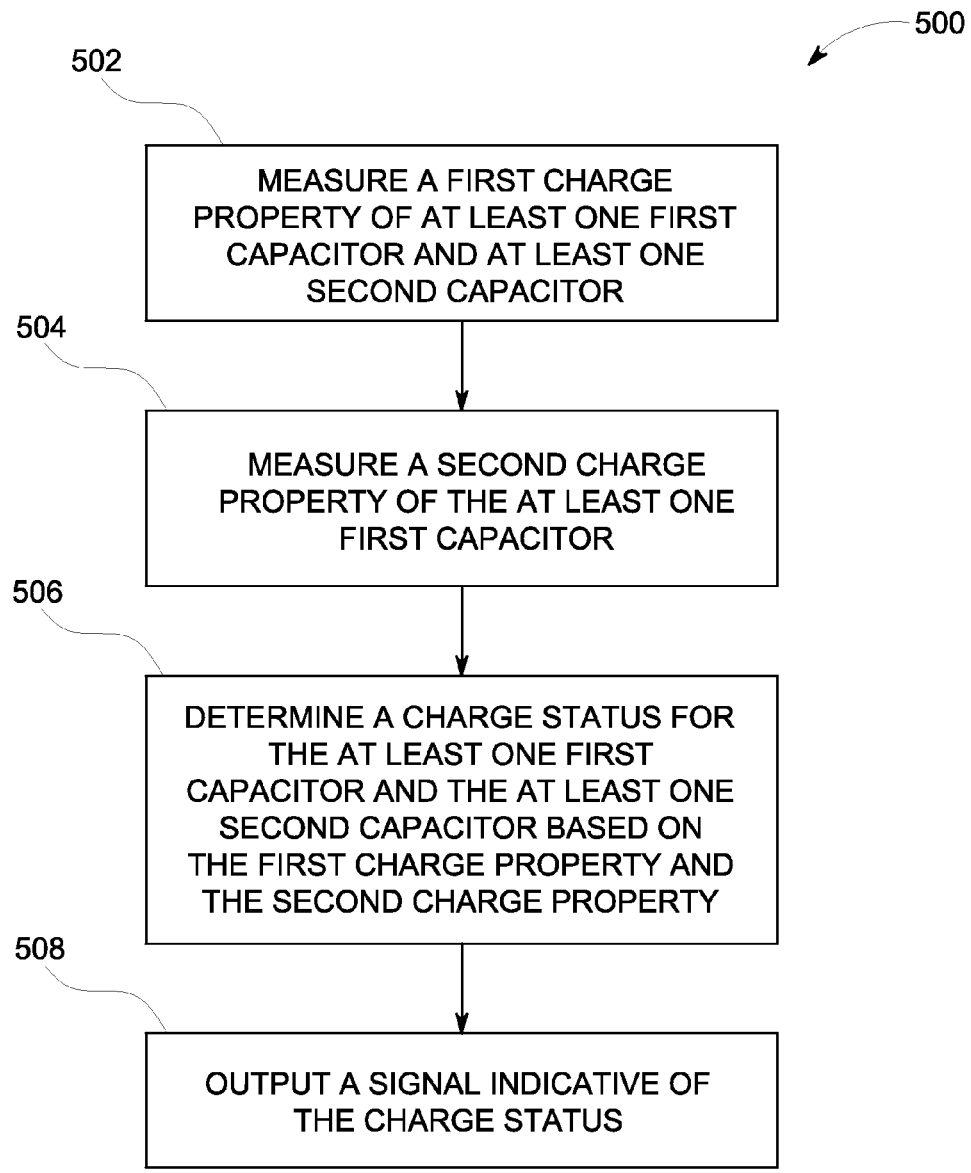
FIG. 6 is a flowchart illustrating an exemplary method that may be used to control the controller shown in FIG. 2.

FIG. 6 is a flowchart 500 that illustrates an exemplary method. More specifically, flowchart 500 illustrates an exemplary method for monitoring capacitance and voltage of a plurality of capacitors, such as first capacitors 210 and second capacitor 212 (both shown in FIG. 3-5) for use in circuit protection device 100 (shown in FIG. 1-3). In an exemplary embodiment, monitoring circuit 306 (shown in FIGS. 4 and 5) measures 502 a first charge property for each of first capacitors 210 and second capacitor 212. For example, comparators 408 and 412 (both shown in FIG. 5) measure a voltage for first capacitors 210 and second capacitor 212. More specifically, second comparator 412 measures a first voltage level of first capacitors 210 and first comparator 408 measures a second voltage level of second capacitor 212. Comparators 412 and 408 compare the first voltage level and the second voltage level, respectively, to a threshold voltage level. Based on a result of the comparison, monitoring circuit 306 determines a first charge status for first capacitors 210 and second capacitor 212.

Moreover, monitoring circuit 306 measures 504 a second charge property for first capacitors 210, such as a rate of voltage change over time. For example, comparators 414 and 420 (both shown in FIG. 5) measure a voltage for first capacitors 210 and determine whether first capacitors 210 acquire the voltage within a desired time period. More specifically, third comparator 414 measures a second voltage of first capacitors 210, and logic gate 416 (shown in FIG. 5) determines whether first capacitors 210 acquire the capacitance associated with the second voltage within a first threshold time period. In addition, fourth comparator 420 measures a third voltage of first capacitors 210, and logic gate 416 determines whether first capacitors 210 acquire the capacitance associated with the third voltage within a second threshold time period. Monitoring circuit 306 then determines a second charge status for first capacitors 210.

In an exemplary embodiment, monitoring circuit 306 also determines 506 an overall charge status for first capacitors 210 and second capacitor 212 based on the first charge property and the second charge property. More specifically, as described above, monitoring circuit 306 determines a first charge status of first capacitors 210 and second capacitor 212, and determines a second charge status of first capacitors 210 only. Monitoring circuit 306 then determines the overall charge status based on the first and second charge statuses.

In one embodiment, monitoring circuit 306 measures a power supply voltage level and compares the measured power supply voltage level to a threshold power supply voltage level. Based on the comparison, monitoring circuit 306 determines a power supply status. In such an embodiment, monitoring circuit 306 determines the overall charge status of first capacitors 210 and second capacitor 212 based on the first charge status of first capacitors 210 and second capacitor 212, the second charge status of first capacitors 212 only, and the power supply status.

In an exemplary embodiment, monitoring circuit 306 outputs 508 a signal indicative of the charge status via one of first output device 308, second output device 310, and third output device 312 (each shown in FIG. 4). For example, when first capacitors 210 and second capacitor 212 acquire the desired charge level within a desired time, monitoring circuit 306 outputs 508 a first signal that causes first output device 308 to indicate the charge status to a user via, for example, a green LED. However, when either first capacitors 210 or second capacitor 212 fails to charge, monitoring circuit 306 outputs 508 a second signal that causes second output device 310 to indicate the charge status to the user via, for example, a red LED. Furthermore, while first capacitors 210 and second capacitors 212 are charging or are discharging, monitoring circuit 306 outputs 508 a third signal that causes third output device 312 to indicate the charge status to the user via, for example, a yellow LED. Monitoring circuit 306 also outputs 508 the third signal if first capacitors 210 and/or second capacitor 212 do not acquire the desired charge level and/or if first capacitors 210 and/or second capacitor 212 do not acquire the desired charge level within a desired time period.

Exemplary embodiments of systems, methods, and apparatus for use in monitoring a capacitance level and a voltage level of a plasma gun power supply are described above in detail. The systems, methods, and apparatus are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

Although the present invention is described in connection with an exemplary circuit protection system, embodiments of the invention are operational with numerous other general purpose or special purpose circuit protection systems or configurations. The circuit protection system described herein is not intended to suggest any limitation as to the scope of use or functionality of any aspect of the invention. Moreover, the circuit protection system described herein should not be interpreted as having any dependency or requirement relating to any one or combination of components illustrated in the exemplary operating environment.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A circuit protection device comprising:
   a plasma gun;
   at least one capacitor communicatively coupled to said plasma gun, said at least one capacitor configured to store electrical energy and to provide the electrical energy to said plasma gun; and
   a monitoring circuit communicatively coupled to said at least one capacitor and configured to:
      measure a charge property of said at least one capacitor;
      determine a charge status of said at least one capacitor based on a comparison of the measured charge property to a threshold value; and
      output at least one signal indicative of the charge status.

2. A circuit protection device in accordance with claim 1, wherein said monitoring circuit is configured to:
   measure a voltage level of said at least one capacitor;
   compare the measured voltage level to a threshold voltage level;
   output at least a first signal when the measured voltage level is equal to or greater than the threshold voltage level; and output at least a second signal when the measured voltage level is less than the threshold voltage level.

3. A circuit protection device in accordance with claim 1, wherein said monitoring circuit is configured to:
measure a time for said at least one capacitor to reach a predetermined capacitance;
compare the measured time to a threshold time; and
output the at least one signal when the measured time is greater than the threshold time.

4. A circuit protection device in accordance with claim 1, wherein said monitoring circuit is configured to:
measure a power supply voltage level;
compare the measured voltage level to a threshold voltage level;
output the at least one signal when the measured voltage level is equal to or greater than the threshold voltage level.

5. A circuit protection device in accordance with claim 1, wherein said at least one capacitor comprises:
at least one first capacitor configured to provide the electrical energy to said plasma gun; and
at least one second capacitor configured to generate a pulse, said plasma gun configured to create a plasma plume using the electrical energy and the pulse.

6. A circuit protection device in accordance with claim 5, further comprising a first output device and a second output device, said monitoring circuit is configured to:
measure a first charge property for each of said at least one first capacitor and said at least one second capacitor;
measure a second charge property of said at least one first capacitor;
determine a charge status of said at least one first capacitor and said at least one second capacitor based on the first charge property and the second charge property;
cause said first output device to output a first indication upon determining that said at least one first capacitor and said at least one second capacitor have a first charge status; and
cause said second output device to output a second indication upon determining that said at least one first capacitor and said at least one second capacitor have a second charge status.

7. A circuit protection device in accordance with claim 6, further comprising a third output device, said monitoring circuit is configured to cause said third output device to output a third indication upon determining that said at least one first capacitor and said at least one second capacitor are being one of charged and discharged.

8. A controller for use with a circuit protection device having a plasma gun, said controller comprising:
a plurality of capacitors comprising:
at least one first capacitor configured to provide electrical energy to the plasma gun; and
at least one second capacitor configured to provide a pulse to the plasma gun to cause the plasma gun to create a plasma plume using the electrical energy; and
a monitoring circuit communicatively coupled to said plurality of capacitors, said monitoring circuit configured to:
measure a first charge property for said at least one first capacitor and said at least one second capacitor;
measure a second charge property for said at least one first capacitor;
determine a charge status for said at least one first capacitor and said at least one second capacitor based on a comparison of the first charge property to a threshold value, and the second charge property; and
output a signal indicative of the charge status.

9. A controller in accordance with claim 8, wherein said monitoring circuit is configured to:
measure a first voltage level of said at least one first capacitor;
measure a second voltage level of said at least one second capacitor;
compare the first voltage level and the second voltage level to a threshold voltage level; and
determine a first charge status for said at least one first capacitor and said at least one second capacitor.

10. A controller in accordance with claim 9, wherein said monitoring circuit is configured to:
measure a capacitance level of said at least one first capacitor;
measure a period of time to charge said at least one first capacitor to the measured capacitance level;
compare the measured time to a threshold time; and
determine a second charge status for said at least one film capacitor.

11. A controller in accordance with claim 10, wherein said monitoring circuit is configured to:
measure a first time period to charge said at least one first capacitor to a third voltage level; and
compare the first time period to a first threshold time period.

12. A controller in accordance with claim 11, wherein said monitoring circuit is configured to:
measure a second time period to charge said at least one first capacitor to a fourth voltage level;
compare the second time period to a second threshold time period.

13. A controller in accordance with claim 10, wherein said monitoring circuit is configured to:
measure a power supply voltage level;
compare the measured power supply voltage level to a threshold power supply voltage level; and
determine a power supply status.

14. A controller in accordance with claim 13, wherein said monitoring circuit is configured to determine an overall charge status for said at least one first capacitor and said at least one second capacitor based on the first charge status, the second charge status, and the power supply status.

15. A controller in accordance with claim 14, further comprising at least one output device communicatively coupled to said monitoring circuit, said monitoring circuit configured to cause said at least one output device to indicate the third charge status.

16. A method for monitoring capacitance and voltage of a plurality of capacitors for use in a circuit protection device, the plurality of capacitors including at least one first capacitor and at least one second capacitor, said method comprising:
measuring a first charge property for each of the at least one first capacitor and the at least one second capacitor;
measuring a second charge property for the at least one first capacitor;
determining a charge status for the at least one first capacitor and the at least one second capacitor based on a comparison of the first charge property to a threshold value, and the second charge property; and
outputting a signal indicative of the charge status.

17. A method in accordance with claim 16, wherein measuring a first charge property comprises:
measuring a first voltage level of the at east one first capacitor;
measuring a second voltage level of the at least one second capacitor;

comparing the first voltage level and the second voltage level to a threshold voltage level; and determining a first charge status for the at least one first capacitor and the at least one second capacitor.

18. A method in accordance with claim 17, wherein measuring a second charge property comprises:

measuring a first time period to charge the at least one first capacitor to a third voltage level;

comparing the first time period to a first threshold time period;

measuring a second time period to charge the at least one first capacitor to a fourth voltage level;

comparing the second time period to a second threshold time period; and determining a second charge status for the at least one first capacitor.

19. A method in accordance with claim 18, further comprising:

measuring a power supply voltage level;

comparing the measured power supply voltage level to a threshold power supply voltage level; and determining a power supply status.

20. A method in accordance with claim 19, wherein determining a charge status for the at least one first capacitor and the at least one second capacitor comprises determining an overall charge status for the at least one first capacitor and the at least one second capacitor based on the first charge status, the second charge status, and the power supply status.

* * * * *

UNITED STATES PATENT AND TRADEMARK OFFICE
CERTIFICATE OF CORRECTION

| | |
|---|---|
| PATENT NO. | : 8,536,838 B2 |
| APPLICATION NO. | : 12/967266 |
| DATED | : September 17, 2013 |
| INVENTOR(S) | : Hooker et al. |

Page 1 of 1

It is certified that error appears in the above-identified patent and that said Letters Patent is hereby corrected as shown below:

In the Claims

In Column 10, Line 19, in Claim 10, delete "film" and insert -- first --, therefor.

In Column 10, Line 64, in Claim 17, delete "at east" and insert -- at least --, therefor.

Signed and Sealed this
Fourteenth Day of January, 2014

Michelle K. Lee
*Deputy Director of the United States Patent and Trademark Office*